(12) United States Patent
Prabhu Gaunkar et al.

(10) Patent No.: US 12,604,670 B2
(45) Date of Patent: Apr. 14, 2026

(54) IN-PACKAGE MAGNETIC SWITCHING USING GLASS CORE TECHNOLOGY

(71) Applicant: Intel Corporation, Santa Clara, CA (US)

(72) Inventors: Neelam Prabhu Gaunkar, Chandler, AZ (US); Telesphor Kamgaing, Chandler, AZ (US); Veronica Strong, Hillsboro, OR (US); Georgios C. Dogiamis, Chandler, AZ (US); Aleksandar Aleksov, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1156 days.

(21) Appl. No.: 17/349,653

(22) Filed: Jun. 16, 2021

(65) Prior Publication Data

US 2022/0406991 A1     Dec. 22, 2022

(51) Int. Cl.
| | |
|---|---|
| *H10N 50/80* | (2023.01) |
| *H01L 23/13* | (2006.01) |
| *H01L 23/15* | (2006.01) |
| *H01L 23/473* | (2006.01) |
| *H01L 23/498* | (2006.01) |
| *H01L 23/66* | (2006.01) |
| *H10B 61/00* | (2023.01) |

(52) U.S. Cl.
CPC ............. *H10N 50/80* (2023.02); *H01L 23/13* (2013.01); *H01L 23/15* (2013.01); *H01L 23/473* (2013.01); *H01L 23/49827* (2013.01);

*H01L 23/49838* (2013.01); *H01L 23/66* (2013.01); *H10B 61/00* (2023.02); *H01L 2223/6677* (2013.01)

(58) Field of Classification Search
CPC ...... H10N 50/80; H10N 50/10; H01Q 1/2283; H01L 23/13; H01L 23/15; H01L 23/473; H01L 23/49827; H01L 23/49838; H01L 23/66; H01L 23/49816; H01L 23/49822; H01L 2223/6677; H10B 61/00
See application file for complete search history.

(56) References Cited

U.S. PATENT DOCUMENTS

| | | | | |
|---|---|---|---|---|
| 5,896,252 | A * | 4/1999 | Kanai | G11B 5/3903 |
| 6,185,961 | B1 * | 2/2001 | Tonucci | B82Y 40/00 |
| | | | | 257/29 |
| 6,473,337 | B1 * | 10/2002 | Tran | G11C 11/5671 |
| | | | | 365/158 |
| 7,211,899 | B2 * | 5/2007 | Taniguchi | H05K 1/115 |
| | | | | 257/E23.009 |
| 8,779,538 | B2 * | 7/2014 | Chen | G01R 33/098 |
| | | | | 360/324 |
| 10,707,413 | B1 * | 7/2020 | Dutta | H10N 50/01 |
| 10,993,014 | B1 * | 4/2021 | Xu | H04R 1/1041 |
| 2005/0045913 | A1 * | 3/2005 | Nguyen | H10N 50/10 |
| | | | | 257/200 |

(Continued)

*Primary Examiner* — William B Partridge
*Assistant Examiner* — Linda J. Fleck
(74) *Attorney, Agent, or Firm* — Schwabe, Williamson & Wyatt, P.C.

(57) ABSTRACT

Embodiments disclosed herein comprise package substrates and methods of forming such package substrates. In an embodiment, a package substrate comprises a core, where the core comprises glass. In an embodiment, an opening if formed through the core. In an embodiment, a magnetic region is disposed in the opening.

24 Claims, 11 Drawing Sheets

(56)     References Cited

U.S. PATENT DOCUMENTS

| | | | |
|---|---|---|---|
| 2005/0051820 A1* | 3/2005 | Stojakovic | G11C 11/22 257/E27.005 |
| 2006/0014346 A1* | 1/2006 | Min | G11C 11/1659 438/257 |
| 2007/0054450 A1* | 3/2007 | Hong | H10N 50/01 438/257 |
| 2008/0182111 A1* | 7/2008 | Nishimura | G01R 33/0005 427/132 |
| 2014/0103540 A1* | 4/2014 | Ching | H01L 23/5226 438/109 |
| 2014/0254254 A1* | 9/2014 | Katayama | G11C 11/1673 365/158 |
| 2017/0140862 A1* | 5/2017 | Yun | H01F 41/042 |
| 2019/0148625 A1* | 5/2019 | Tseng | A61K 8/731 365/158 |
| 2019/0206780 A1* | 7/2019 | Chatterjee | H01L 23/49816 |
| 2019/0279806 A1* | 9/2019 | Darmawikarta | H01F 27/2804 |
| 2020/0161536 A1* | 5/2020 | Shirotori | H10N 50/10 |
| 2020/0227338 A1* | 7/2020 | Gong | H01L 23/3735 |
| 2020/0235291 A1* | 7/2020 | Park | H10N 50/80 |
| 2021/0305154 A1* | 9/2021 | Wang | H01L 23/53228 |
| 2022/0077064 A1* | 3/2022 | Choi | H01L 23/49833 |
| 2023/0282546 A1* | 9/2023 | Waidhas | H01L 23/3672 257/678 |
| 2024/0395661 A1* | 11/2024 | Ahmed | H01L 23/49827 |

* cited by examiner

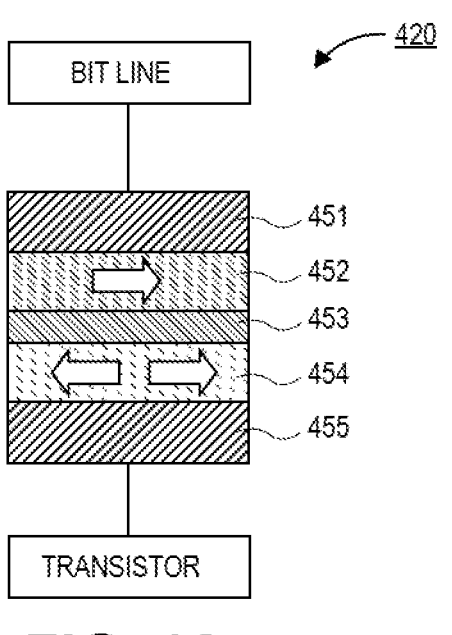
FIG. 4A
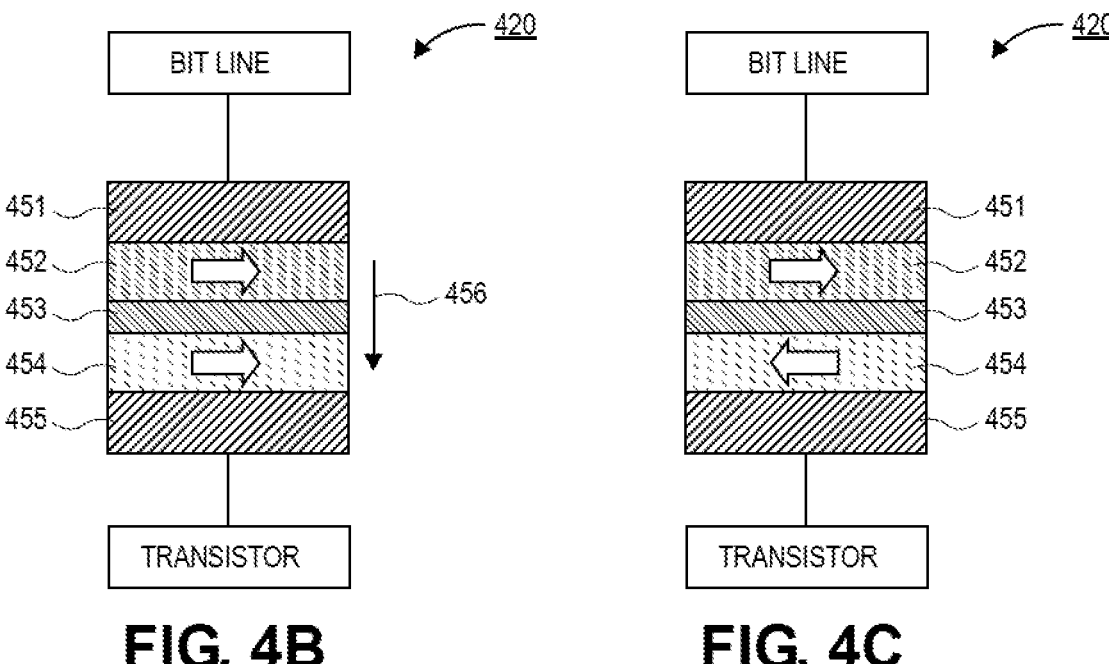
FIG. 4B          FIG. 4C

IN-PACKAGE MAGNETIC SWITCHING USING GLASS CORE TECHNOLOGY

TECHNICAL FIELD

Embodiments of the present disclosure relate to electronic packages, and more particularly to package substrates with a glass core and magnetic switching architectures embedded in the glass core.

BACKGROUND

Embedding magnetic materials into package cores allows for the integration of several devices in the package. Typically, inductors are integrated in-package for voltage regulation applications. The inductors generally are formed by providing a magnetic shell around a plated through hole in the package core. Traditional core technologies (e.g., glass fiber reinforced epoxy, or copper clad laminates (CCLs)) limit the dimensions of the plated through holes. The limitations stem from the use of mechanical drilling needed to form the through holes. For example, diameters of the plated through holes may be approximately 100 μm or larger and the pitch between through holes may be approximately 250 μm or larger. The large dimensions make it difficult to utilize magnetic materials for more advanced applications, such as magnetic memory and/or magnetic switching architectures within the package.

Currently, in order to integrate switching functionality into the electronic package, a die is embedded within the package. However, such solutions raise significant thermal challenges in addition to increasing the complexity of integration and manufacturability. As such, magnetic materials within the package substrate are primarily limited to use for passive devices such as inductors.

BRIEF DESCRIPTION OF THE DRAWINGS

FIG. 4A is a schematic of a magnetic tunnel junction (MTJ) with a pinned magnetic layer and an unpinned magnetic layer, in accordance with an embodiment.

FIG. 4B is a schematic of the MTJ with the unpinned magnetic layer oriented parallel with the pinned magnetic layer to allow current to flow, in accordance with an embodiment.

FIG. 4C is a schematic of the MTJ with the unpinned magnetic layer oriented antiparallel with the pinned magnetic layer to prevent the flow of current, in accordance with an embodiment.

EMBODIMENTS OF THE PRESENT DISCLOSURE

Figure 1A:
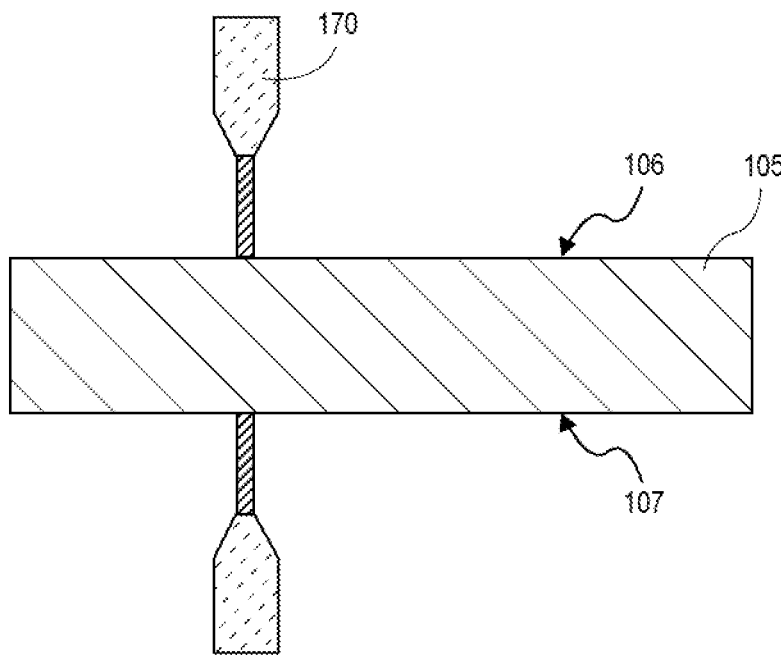
FIG. 1A is a cross-sectional illustration of a glass core with top and bottom surfaces that are being exposed with a laser, in accordance with an embodiment.

Described herein are package substrates with a glass core and magnetic switching architectures embedded in the glass core, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, existing through core vias are formed with mechanical drilling processes. This results in relatively large via diameters and pitches. The large feature size limits the integration of magnetic material into the core. As a result, magnetic materials are primarily restricted to being used as passive devices, such as inductors. That is, existing processes do not make it feasible to integrated magnetic switching devices into the package core.

Accordingly, embodiments disclosed herein include package core substrates that are manufactured out of a material that can be patterned with a laser exposure and etching process. The laser exposure creates a morphological change in the core substrate. The morphological change can then be used to selectively etch away portions of the core substrate to form through holes. Magnetic material may then be disposed into the holes to provide vertically or horizontally oriented magnetic switching and/or magnetic memory within the core substrate. In an embodiment, the core substrate may be glass, ceramic, silicon, or any other non-conductive semiconductor material.

The laser-assisted etching process allows for the formation of crack free, high-density via holes into the core substrate. Whereas existing through core vias have diameters of 100 μm or larger and pitches of 250 μm or larger, the laser-assisted etching process may enable hole diameters that are approximately 50 μm or smaller and pitches that are approximately 40 μm or larger. Diameters of the holes may be able to be approximately 10 μm without masks, and potentially as small as 2 μm when a hardmask is also used. The thickness of the core may also be between approximately 100 μm and 1,000 μm. Though it is to be appreciated that embodiments may also apply to larger and/or smaller hole diameters, hole pitches, and core substrate thicknesses.

In addition to the formation of magnetic switching features, the laser-assisted etching process may also be harnessed to provide alternative functionalities within the core substrate. For example, the holes may be left voided in the final structure (e.g., to function as a fluidic pathway). Additionally, the laser exposure may be tuned to provide different structural features within the core. For example, blind vias may be formed partially through the thickness of the core substrate.

Referring now to FIGS. 1A-1D, a series of cross-sectional illustrations depicting a process for forming a vertically oriented magnetic structure in a core substrate 105 using a laser-assisted etching process is shown, in accordance with an embodiment. As shown in FIG. 1A, the core substrate 105 is exposed by a laser 170. The laser 170 may be irradiated over both a first surface 106 and a second surface 107. However, the laser 170 may only irradiate a single surface in of the core substrate 105 in other embodiments.

In an embodiment, the core substrate 105 may comprise a material that is capable of forming a morphological change as a result of the exposure by the laser 170. For example, in the case of a glass core substrate 105, the morphological change may result in the conversion of an amorphous crystal structure to a crystalline crystal structure. While glass is used as an example here, it is to be appreciated that the core substrate 105 may also comprise ceramic materials, silicon, or other non-conductive semiconductor materials. In an embodiment, the core substrate 105 may have a thickness between the first surface 106 and the second surface 107 that is between 100 μm and 1,000 μm. However, it is to be appreciated that larger or smaller thicknesses may also be used for the core substrate 105 in other embodiments.

Figure 1B:
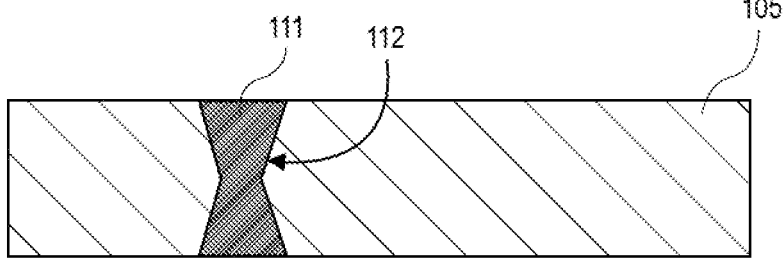
FIG. 1B is a cross-sectional illustration of the glass core with regions that have their morphology altered by the laser, in accordance with an embodiment.

Referring now to FIG. 1B, a cross-sectional illustration of the core substrate 105 after the morphological change has occurred is shown, in accordance with an embodiment. As shown, an exposed region 111 is provided through a thickness of the core substrate 105. In an embodiment, the exposed region 111 may have sidewalls 112 that are sloped. That is, the sidewalls 112 may not be substantially vertical (with respect to the first surface 106 and the second surface 107). In a particular embodiment, the exposed region 111 may have an hourglass shaped cross-section that results from exposure from laser exposure on both the first surface 106 and the second surface 107. As used herein, an hourglass shaped cross section may refer to a shape that starts with a first width on a first end, decreases in width while moving away from the first end until reaching a minimum width between the first end and a second end, and increasing in width while moving from the minimum width in the middle towards the second end. That is, the shape may have a middle region that is narrower in width than the widths of the opposing ends. In an embodiment, the sidewalls 112 may have a slope that is approximately 10° or less away from vertical. While shown with sloped sidewalls 112, it is also to be appreciated that embodiments may include substantially vertical sidewalls depending on the laser parameters and the material of the core substrate 105.

Figure 1C:
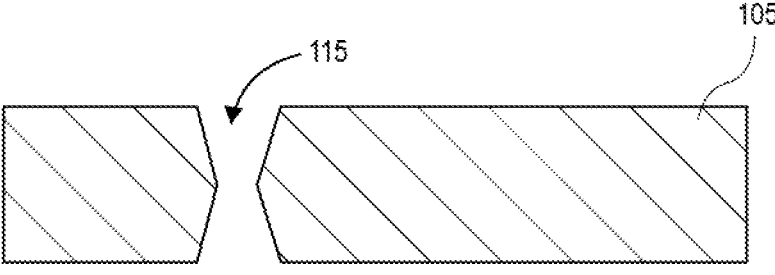
FIG. 1C is a cross-sectional illustration of the glass core with a via hole through a thickness of the glass core, in accordance with an embodiment.

Referring now to FIG. 1C, a cross-sectional illustration of the core substrate 105 after the exposed region 111 is removed to form a hole 115 through the core substrate 105 is shown, in accordance with an embodiment. In an embodiment, the hole 115 may be formed with an etching process that is selective to the exposed region 111 over the remainder of the core substrate 105. The etch selectivity of the exposed region 111 to the remainder of the core substrate 105 may be 10:1 or greater, or 50:1 or greater. That is, while selective to the exposed region 111, some portion of the core substrate 105 may also be etched, resulting in the thickness of the core substrate 105 being slightly reduced. In an embodiment, the etchant may be a wet etching chemistry.

Figure 1D:
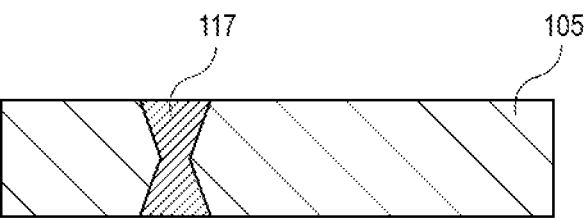
FIG. 1D is a cross-sectional illustration of the glass core with a via through the thickness of the glass core, in accordance with an embodiment.

Referring now to FIG. 1D, a cross-sectional illustration of the core substrate 105 after a magnetic structure 117 is formed in the hole 115 is shown, in accordance with an embodiment. In an embodiment, the magnetic structure 117 may be deposited with a plating process or any other suitable deposition process. While shown schematically in FIG. 1D as a single material layer, it is to be appreciated that the magnetic structure may comprise a plurality of different layers, and some of layers may not necessarily be magnetic. For example, the magnetic structure 117 may comprise one or more layers of magnetic material. Barrier layers and the like may also be provided between magnetic layers. Conductive material may also fill portions of the hole 115 to provide electrical connection to the magnetic layers. In yet another embodiment, the hole 115 may remain unfilled in order to provide features such as liquid cooling channels. A more detailed description of the magnetic structures 117 is described in greater detail below.

In an embodiment, the hole 115 may have a maximum diameter that is approximately 100 μm or less, approximately 50 μm or less, or approximately 10 μm or less. The pitch between individual holes 115 in the core substrate 105 may be between approximately 10 μm and approximately 100 μm in some embodiments. The small diameters and pitch (compared to traditional plated through hole (PTH) vias that typically have diameters that are 100 μm or larger and pitches that are 100 μm or larger) allow for high density integration of vertically oriented magnetic features 117. As such, the magnetic features 117 may be utilized in circuits to provide magnetic memory applications and/or to provide for switching between devices in the electronic package.

Figure 1E:
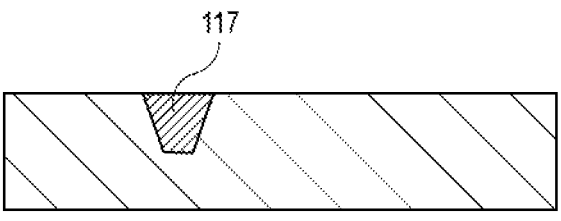
FIG. 1E is a cross-sectional illustration of the glass core with a via partially through a thickness of the glass core.

Referring now to FIG. 1E, a cross-sectional illustration of the core substrate 105 with a magnetic structure 117 in accordance with an additional embodiment. Instead of passing through an entire thickness of the core substrate 105, the magnetic structure 117 may pass partially through a thickness of the core substrate 105. Such a configuration may be referred to a blind feature.

In FIGS. 1A-1D only a single cross-section of the core substrate 105 is shown for simplicity. However, it is to be appreciated that the shape of the magnetic structures 117 may take substantially any form. This is because the laser providing the morphological change in the core substrate 105 may be moved in a controllable manner. Examples of various plan views of a magnetic structures 217 in a core substrate 205 are shown in FIGS. 2A and 2B.

Figure 2A:
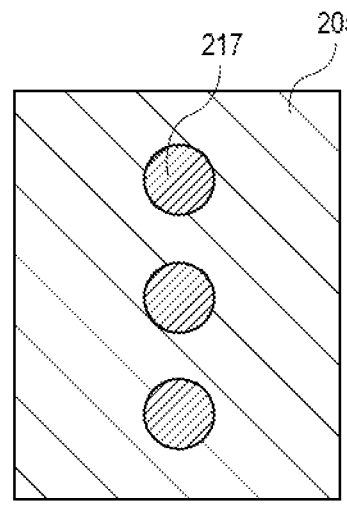
FIG. 2A is a plan view illustration of the glass core with a plurality of circular vias, in accordance with an embodiment.

Referring now to FIG. 2A, a plan view illustration of a core substrate 205 with a plurality of circular magnetic structures 217 is shown, in accordance with an embodiment. While three magnetic structures 217 are shown, it is to be appreciated that any number of magnetic structures 217 may be provided in any configuration. For example, the magnetic structures 217 may be electrically coupled to each other in order to provide certain features, such as magnetic memory blocks.

Figure 2B:
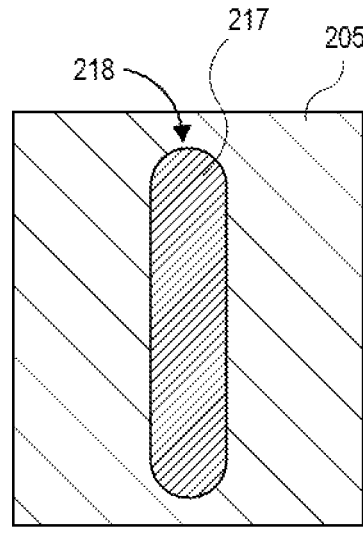
FIG. 2B is a plan view illustration of the glass core with a vertical via plane, in accordance with an embodiment.

Referring now to FIG. 2B, a plan view illustration of a core substrate 205 with a magnetic structure 217 that is extended along one direction is shown, in accordance with an embodiment. Such a magnetic structure 217 may be referred to herein as a "magnetic plane" or simply a "plane". The magnetic plane 217 may have a thickness through the core substrate 205 that is substantially uniform, while also being extended in a direction, as opposed to having a width and length that are substantially uniform. As shown in FIG. 2B, the ends of the magnetic structure 217 may be rounded surfaces 218. The rounded surfaces may be the result of the shape of the laser irradiation. That is, the focus of the laser may be substantially circular in some embodiments.

Figure 3A:
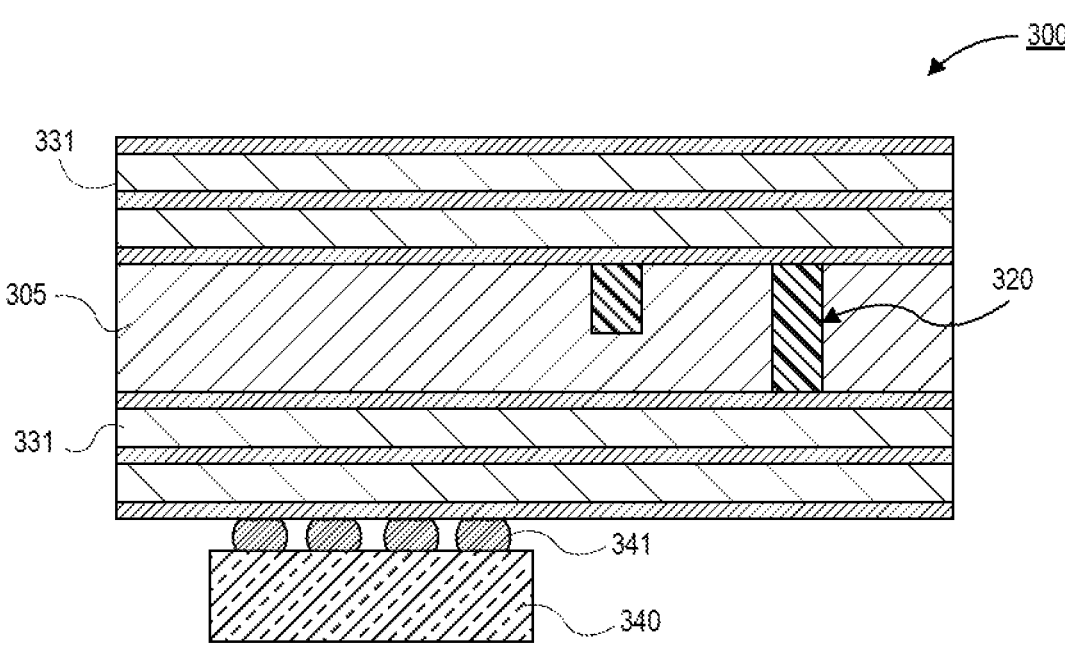
FIG. 3A is a cross-sectional illustration of an electronic package with an integrated magnetic feature in the package core, in accordance with an embodiment.

Referring now to FIG. 3A, a cross-sectional illustration of an electronic package 300 is shown, in accordance with an embodiment. In an embodiment, the electronic package 300 comprises a package substrate with a core 305 and buildup layers 331 over the core 305. The core 305 may be a material that can be morphologically changed using a laser process, as described above. For example, the core 305 may comprise glass in some embodiments. A die 340 may be coupled to the package substrate by interconnects 341.

In an embodiment, one or more magnetic structures 320 may be embedded in the core 305. The magnetic structures 320 in FIG. 3A are illustrated as a monolithic block for simplicity of the Figure. However, the magnetic structures 320 may take the form of any of the magnetic structures described in greater detail below. For example, the magnetic structures 320 may be a magnetic tunnel junction (MTJ) or other magnetic based switching architecture. The magnetic structures 320 may be fabricated with a laser-assisted etching process, similar to embodiments described above. In an embodiment, the magnetic structures 320 may be communicatively coupled to the die 340 through the buildup layer 331. As shown, the magnetic structures 320 may pass through an entire thickness of the core 305. In other embodiments, the magnetic structures 320 may have be blind structures that do not pass through an entire thickness of the core 305.

Figure 3B:
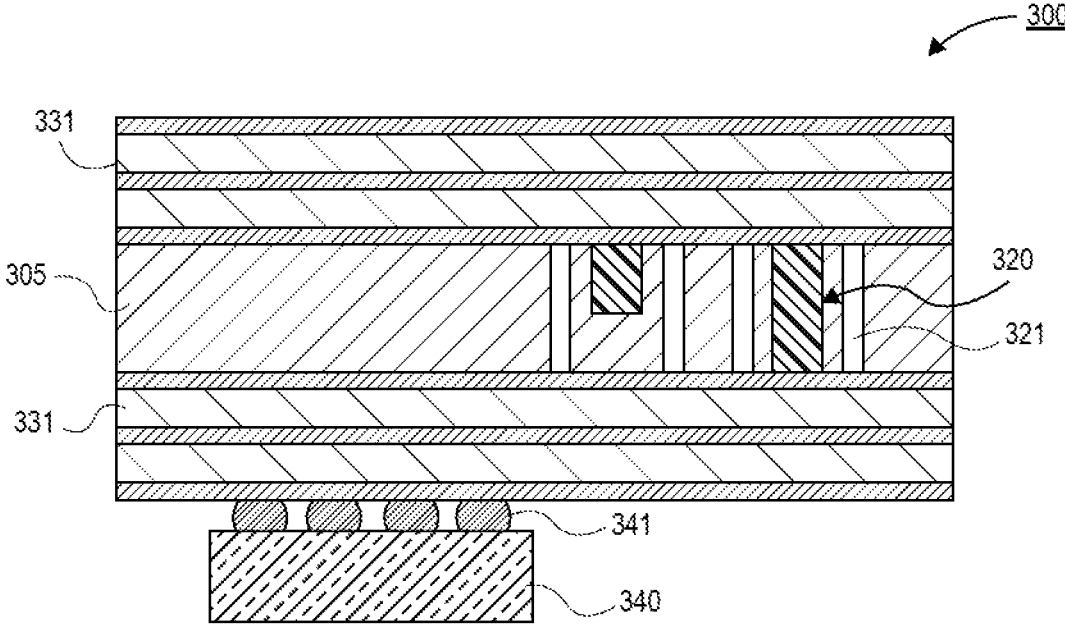
FIG. 3B is a cross-sectional illustration of an electronic package with an integrated magnetic feature in the package core with cooling channels around the magnetic feature, in accordance with an embodiment.

Referring now to FIG. 3B, a cross-sectional illustration of an electronic package 300 is shown, in accordance with an additional embodiment. The electronic package 300 in FIG. 3B may be substantially similar to the electronic package 300 in FIG. 3A, with the exception of the addition of cooling channels 321. The cooling channels 321 may be adjacent to the magnetic structure 320 to provide improved thermal control of the magnetic structures 320. The cooling channels 321 may be holes manufactured through the core using a laser-assisted etching process. Instead of filling the cooling channels 321 with a magnetic structure (or other solid structure) the holes are left open in order to allow for the flow of a coolant (e.g., water) through the cooling channels 321. The cooling channels may be fluidically coupled to a coolant source (not shown) through the buildup layers 331.

Referring now to FIG. 4A, a schematic of an MTJ structure 420 is shown, in accordance with an embodiment. The MTJ structure 420 may be provided in a hole through the package core (not shown). The MTJ structure may comprise a first magnetic layer 452 and a second magnetic layer 454. For example, the first magnetic layer 452 and the second magnetic layer 454 may be ferromagnets. A barrier layer 453, such as an oxide, may separate the first magnetic layer 452 from the second magnetic layer 454. Conductive contacts 451 and 455 may be provided over the magnetic layers 452 and 454.

In an embodiment, the first magnetic layer 452 may be pinned. That is, the magnetic orientation of the first magnetic layer 452 may be static, as indicated by an arrow pointing in a single direction. The second magnetic layer 454 may be unpinned so that the magnetic orientation of the second magnetic layer 454 may be switched. As shown, the second magnetic layer 454 is represented as having two arrows facing opposite directions.

Referring now to FIGS. 4B and 4C, schematics of the MTJ structures 420 in different states are shown. As shown in FIG. 4B, the second magnetic layer 454 is controlled to have a magnetic orientation that is parallel to the magnetic orientation of the first magnetic layer 452. When the two magnetizations are aligned, the electrons will tunnel through the barrier 453 (as indicated by arrow 456) leading to a conductive path. If the two magnetic layers 452 and 454 are antiparallel (as shown in FIG. 4C), the electrons will not tunnel through the barrier 453. Thus, the MTJ structure 420 can be switched between two binary states — low resistance and high resistance. When experiencing a low resistance path (i.e., the magnetizations are aligned), the MTJ structure 420 is in a logic state "1". When experiencing a high resistance path (i.e., the magnetizations are antiparallel), the MTJ structure 420 is in a logic state "0".

Figure 4D:
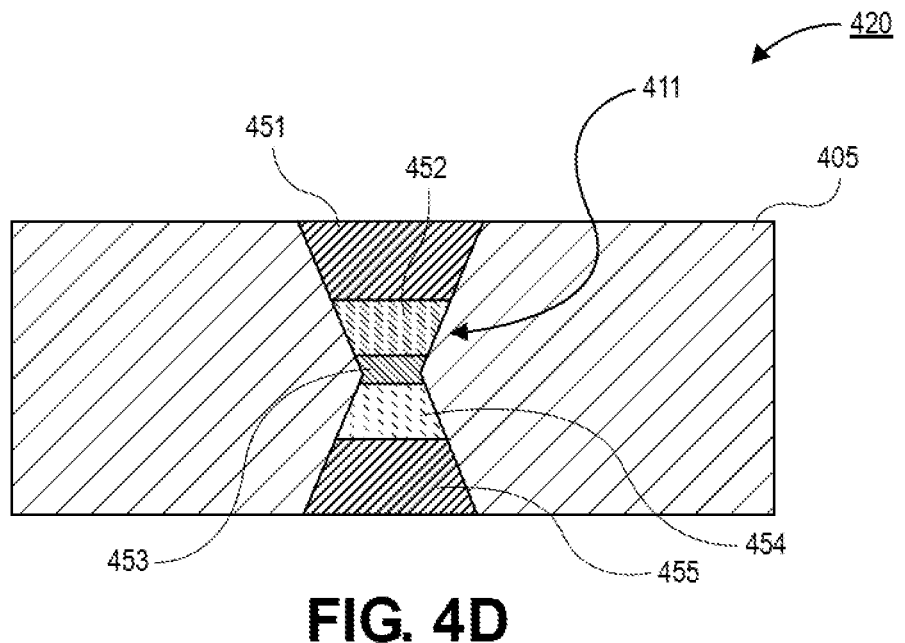
FIG. 4D is a cross-sectional illustration of an MTJ that is integrated into a package core using a laser-assisted etching process, in accordance with an embodiment.

Referring now to FIG. 4D, a cross-sectional illustration of an MTJ structure 420 is shown, in accordance with an embodiment. As shown, the MTJ structure may be embedded within a package core 405. For example, the package core 405 may be a glass core or the like. The hole through the package core 405 may be fabricated with a laser-assisted etching process, such as those described in greater detail above. In an embodiment, the glass etching process may result in the hole having sloped sidewalls 411. As such, the widths of each layer 451-455 may be non-uniform. For example, the MTJ structure 420 may have an hourglass shaped cross-section. Another option may be to create a blind hole and place magnetic materials within this hole. The hour-glass shape pertains to the type of material used and may not be applicable when blind features are created.

In an embodiment, the magnetic layers 452 and 454 may have thicknesses that are on the tens of nanometer scale. In other embodiments, multiple layers of ferromagnetic material are deposited to ensure that the required levels of magnetization can be obtained. The magnetic layers 452 and 454, the barrier 453, and the contacts 451 and 455 may be deposited in the hole with any suitable material deposition process. For example, sputtering, chemical vapor deposition (CVD), physical vapor deposition (PVD), or other plating processes may be used to deposit the layers into the hole through the package core 405.

Figure 4E:
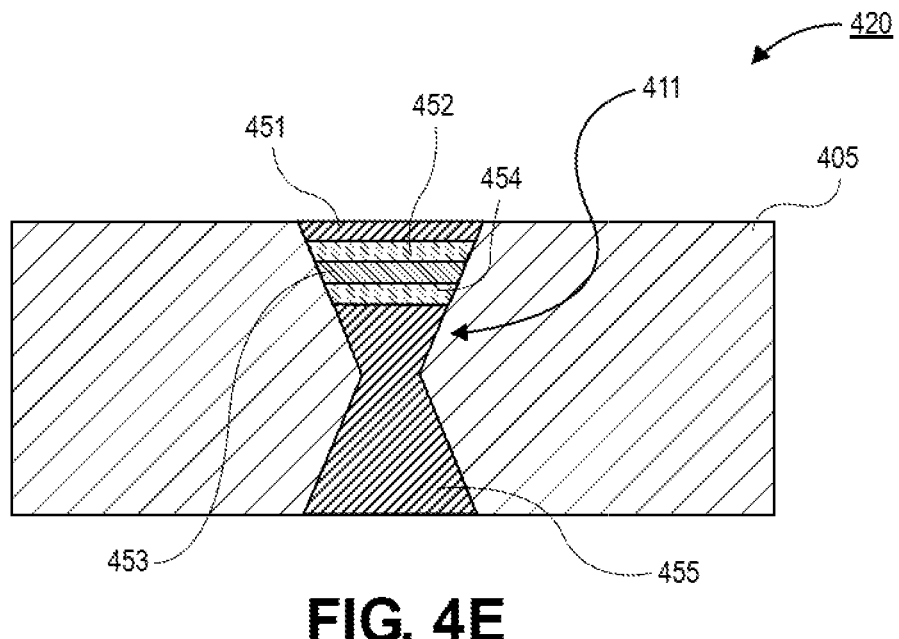
FIG. 4E is a cross-sectional illustration of an MTJ that is integrated into a package core using a laser-assisted etching process, in accordance with an additional embodiment.

Referring now to FIG. 4E, a cross-sectional illustration of an MTJ structure 420 is shown, in accordance with an additional embodiment. The MTJ structure 420 in FIG. 4E is substantially similar to the MTJ structure 420 of FIG. 4D, with the exception of the layers of the MTJ structure 420 being shifted up towards a top surface of the core 405. Similarly, the MTJ structure 420 may be shifted down towards a bottom surface of the core 405. That is, the MTJ structure 420 does not need to be at the midpoint of the core 405 in all embodiments.

In the embodiments illustrated in FIGS. 4A-4E, a single MTJ structure 420 is shown. However, it is to be appreciated that a plurality of MTJ structures 420 may be fabricated in the package core 405 and connected together to provide a memory cell. The inclusion of memory cells on the package substrate has several benefits. One such benefit is security based. Particularly, an off-die memory location may be impervious to hardware security attacks. The laser-assisted patterning process allows for high densities of the MTJ structures 420 to be manufactured within the package core 405. Furthermore, the vertical orientation of the MTJ structures 420 allows for a large number of MTJs 420 to be fabricated within a small footprint.

Figure 5A:
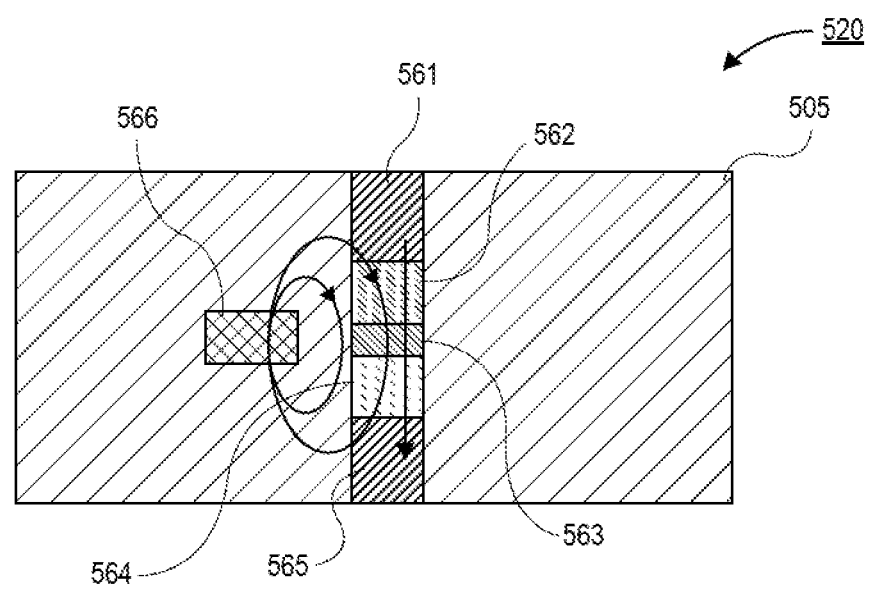
FIG. 5A is a cross-sectional illustration of a magnetic switch that is controlled by an adjacent current carrying trace, in accordance with an embodiment.

Referring now to FIG. 5A, a cross-sectional illustration of a magnetic switch 520 is shown, in accordance with an embodiment. In an embodiment, the magnetic switch 520 is embedded within a package core 505. The magnetic switch 520 comprises a magnetic layer 563. A pair of barrier layers 562 and 564 is provided over the ends of the magnetic layer 563. Contacts 561 and 565 are formed over the barrier layers 562 and 564.

In an embodiment, the magnetic switch 520 further comprises a conductive trace 566 that is adjacent to the magnetic layer 563. When current flows in the adjacent conductive trace 566, the magnetic field lines (oval arrows) cause the magnetization in the magnetic layer 563 to realign. This allows for conduction through the magnetic switch 520 as indicated by the vertical arrow. Such switching mechanisms can serve as a low power switching architecture since the switching is activated only when current flows through the adjacent trace 566.

In an embodiment, the magnetic switch 520 may be formed using a laser-assisted etching process. In some embodiments, the layers of the magnetic switch 520 may be deposited in a hole through the package core 505. While shown as having substantially vertical sidewalls, it is to be appreciated that the magnetic switch 520 may also have an hourglass shaped cross-section typical of laser-assisted etching processes, such as those described above.

Figure 5B:
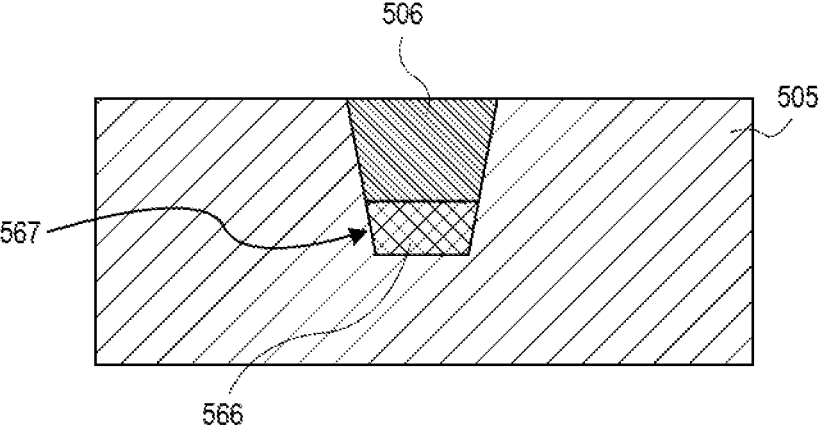
FIG. 5B is a cross-sectional illustration of the current carrying trace with a plug material over a top surface of the trace, in accordance with an embodiment.
Figure 5C:
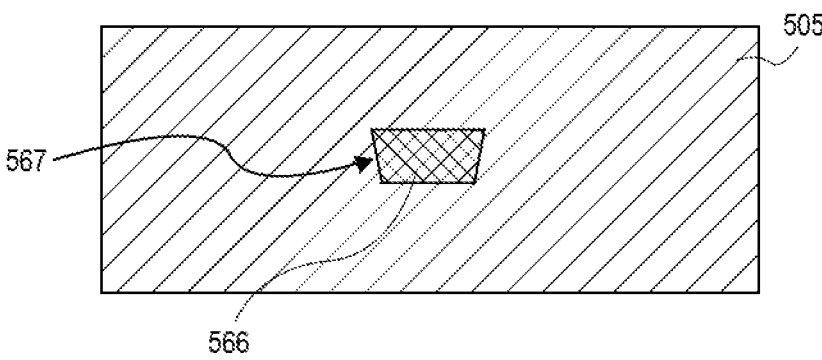
FIG. 5C is a cross-sectional illustration of the current carrying trace that is entirely embedded within the glass core or at an interface between two glass cores, in accordance with an embodiment.

In an embodiment, the adjacent conductive trace 566 may also be formed using a laser-assisted etching process. Examples of the structure of the conductive trace 566 are shown in FIGS. 5B and 5C. Referring now to FIG. 5B, a cross-sectional illustration of the conductive trace 566 is shown, in accordance with an embodiment. As shown, a blind trench is formed into the package core 505. That is, the trench does not pass entirely through a thickness of the package core 505. The conductive trace 566 may be disposed in the trench and a plug 506 may cover the conductive trace 566. That is, the package core 505 may cover three of the surfaces of the conductive trace 566, and a plug 506 may cover one of the surfaces of the conductive trace 566. Due to the sloped sidewalls 567 typical of laser-assisted etching processes, the conductive trace 566 may have a trapezoidal cross-section.

Referring now to FIG. 5C, a cross-sectional illustration of the conductive trace 566 is shown, in accordance with an additional embodiment. Instead of including a plug 506, the conductive trace 566 is entirely embedded by the package core 505. Such buried embodiments are possible by tuning the focus point of the laser in the laser-assisted etching process. Alternatively, the conductive trace 566 may be provided at the interface between two core substrates 505 that are adhered together.

Figure 6A:
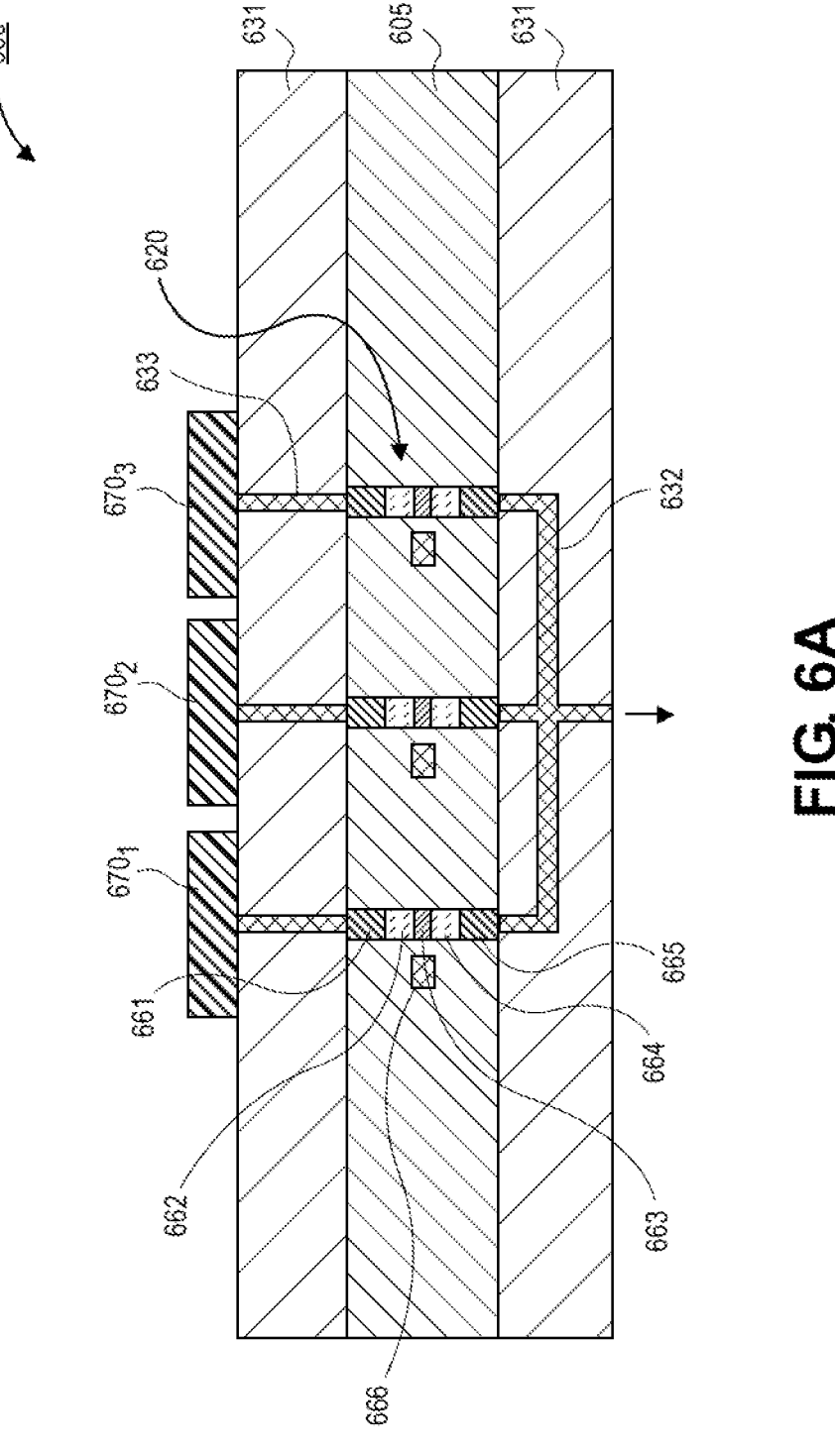
FIG. 6A is a cross-sectional illustration of an electronic package that comprises a plurality of magnetic switches to provide selective control of various devices within the electronic package, in accordance with an embodiment.

Referring now to FIG. 6A, a cross-sectional illustration of an electronic package 600 is shown, in accordance with an additional embodiment. In the illustrated embodiment, the electronic package 600 comprises a package core 605 and buildup layers 631 above and below the package core 605. A plurality of devices $670_1$ to $670_3$ may be provided on the electronic package 600. For example, the devices $670_1$ to $670_3$, may comprise antennas for providing wireless communications. In other embodiments, the devices $670_1$ to $670_3$ may be dies or other structures. In the illustrated embodiment, the plurality of devices $670_1$, $670_2$, and $670_3$ are shown above the buildup layers 631. However, it is to be appreciated that one or more of the plurality of devices $670_1$, $670_2$, and $670_3$ may be embedded in the buildup layers 631 in some embodiments.

In an embodiment, each of the devices $670_1$ to $670_3$ are coupled to a different magnetic switch 620. Each of the magnetic switches 620 may be substantially similar to the magnetic switch 520 described above with respect to FIG. 5A. For example, the magnetic switches 620 may comprise a magnetic layer 663, barrier layers 662 and 664, and contacts 661 and 665. The contacts 661 and 665 may be electrically coupled to traces 633 and 632 in the buildup layers. A conductive trace 666 may also be adjacent to the magnetic layer 663 in order to provide switching functionality to the magnetic switches 620.

As shown, the traces 632 are each connected to a single output (indicated by an arrow). By controlling which magnetic switch 620 is activated, individual ones of the devices 670 can be coupled to the single output. As such, power savings are provided since each of the devices 670 do not need to be constantly powered. Additionally, while shown in a vertical orientation, embodiments are not limited to such configurations. For example, the magnetic switches 620 may be oriented in a horizontal direction as well.

Figure 6B:
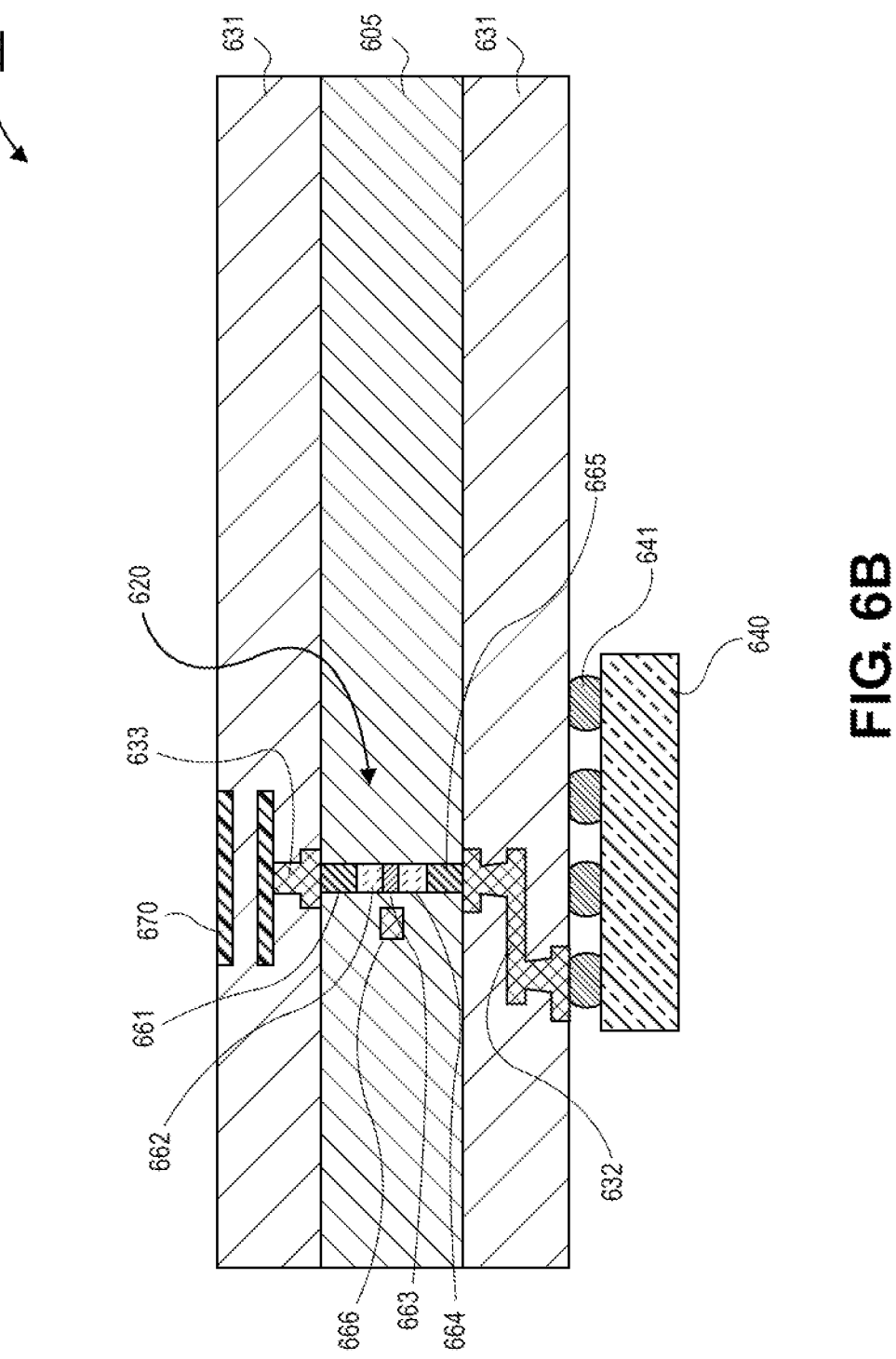
FIG. 6B is a cross-sectional illustration of an electronic package that comprises a magnetic switch that is controlled by a current carrying trace that allows for signals to be received and transmitted by an antenna, in accordance with an embodiment.

Referring now to FIG. 6B, a cross-sectional illustration of an electronic package 600 is shown, in accordance with an additional embodiment. In an embodiment, the electronic package 600 comprises a magnetic switch 620 embedded in the package core 605. The magnetic switch 620 is electrically coupled between an antenna 670 and a die 640 that is flip-chip mounted to the buildup layer 631 by interconnects 641.

In an embodiment, the antenna 670 is configured to receive and transmit wireless signals. The direction the signal flows within the electronic package 600 is controlled by the magnetic switch 620. When the antenna 670 is in a transmit mode, the conductive trace 666 propagates current in a first direction that aligns the magnetic layer 663 to allow the signal to flow from the die 640 to the antenna 670. When the antenna is in a receive mode, the conductive trace 666 propagates current in an opposite second direction that aligns the magnetic layer 663 to allow the signal to flow from the antenna 670 to the die 640.

Figure 6C:
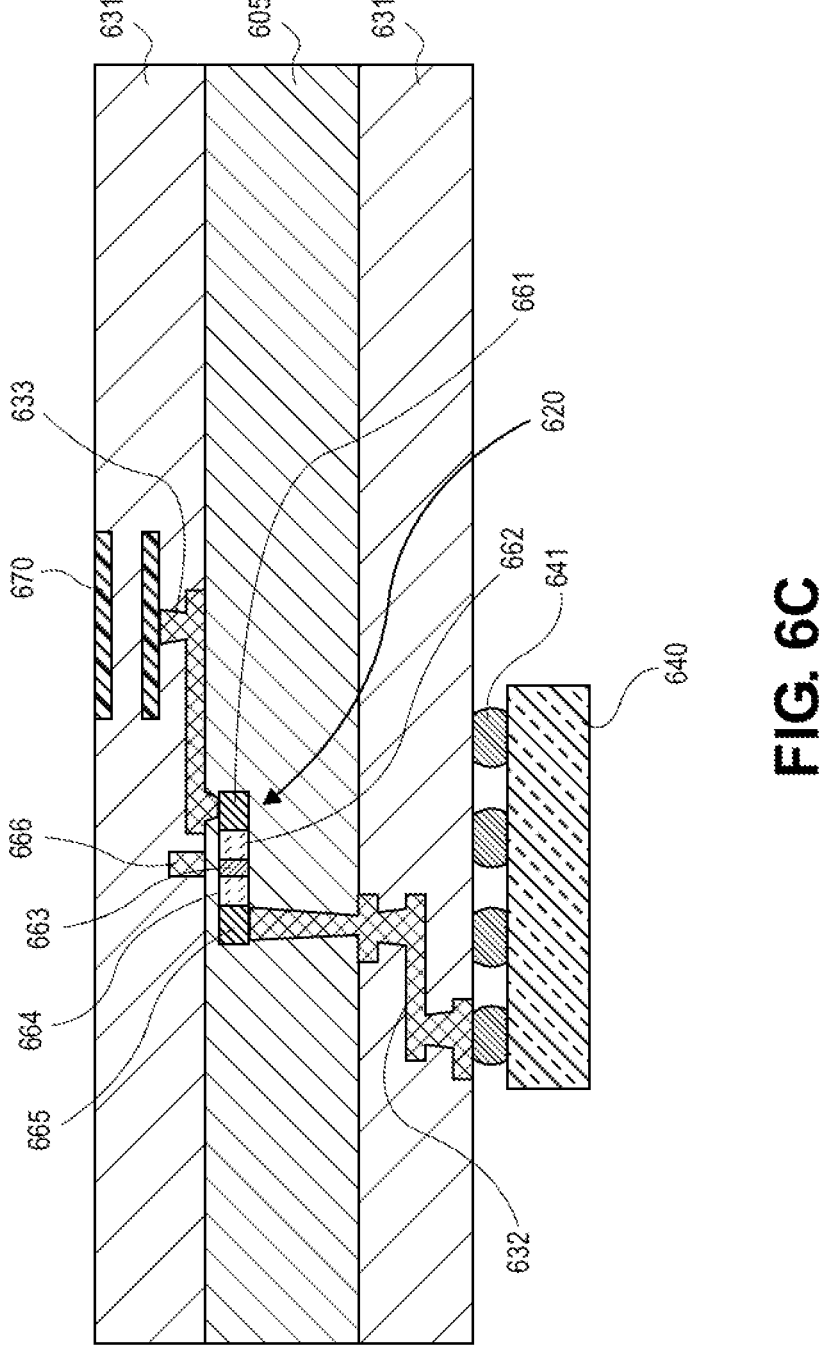
FIG. 6C is a cross-sectional illustration of an electronic package that comprises a horizontal magnetic switch that is controlled by a current carrying trace, in accordance with an embodiment.

Referring now to FIG. 6C, a cross-sectional illustration of an electronic package 600 that comprises a horizontal magnetic switch that is controlled by a current carrying trace is shown, in accordance with an embodiment. The electronic package 600 in FIG. 6C may be substantially similar to the electronic package 600 in FIG. 6B, with the exception of the magnetic switch 620 being oriented horizontally within the core 605. In an embodiment, the adjacent conductive trace 666 is over the core 605 in the buildup layers 631. In other embodiments, the conductive trace 666 may also be embedded in the core 605.

Figure 7:
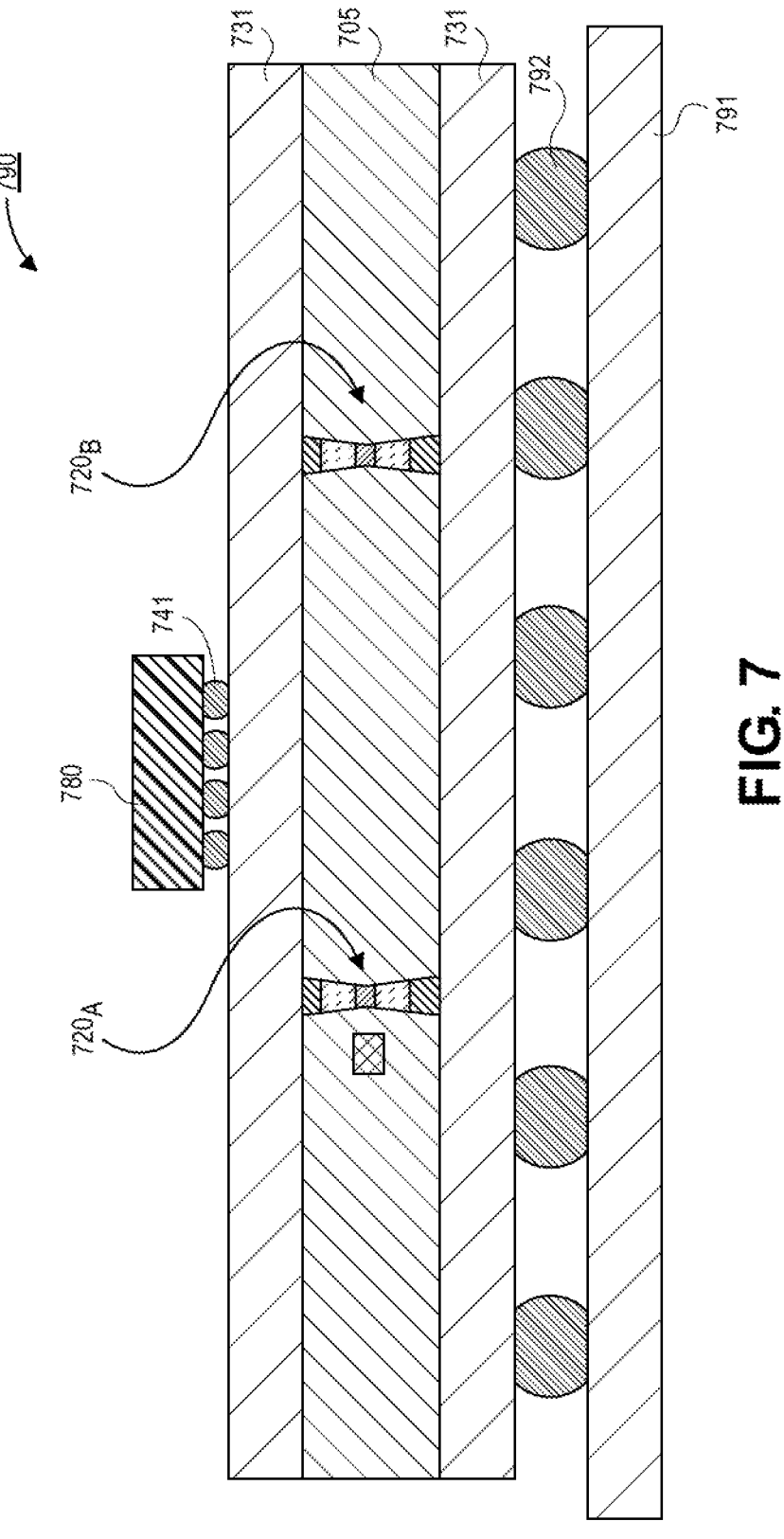
FIG. 7 is a cross-sectional illustration of an electronic system that comprises a package substrate with embedded magnetic switching structures, in accordance with an embodiment.

Referring now to FIG. 7, a cross-sectional illustration of an electronic system 790 is shown, in accordance with an embodiment. In an embodiment, the electronic system 790 comprises a board 791, such as a printed circuit board (PCB). The board 791 may be electrically coupled to a buildup layer 731 of a package substrate by interconnects 792. The interconnects 792 may comprise solder balls, sockets, or any other suitable interconnect architecture. A die 780 may be electrically coupled to the package substrate by first level interconnects (FLIs) 741.

In an embodiment, the package substrate comprises a package core 705 with buildup layers 731 above and/or below the package core 705. The package core 705 may comprise a glass core or other material capable of being morphologically changed by laser exposure. In an embodiment, vertically oriented magnetic switches 720 may be embedded in the package core 705. While two magnetic switches 720$_A$ and 720$_B$ are shown for simplicity, it is to be appreciated that any number of magnetic switches 720 may be embedded in the package core 705.

In an embodiment, a first magnetic switch 720$_A$ may have a structure with a single magnetic layer with barrier layers above and below the magnetic layer. A conductive trace adjacent to the magnetic layer controls the flow of current through the first magnetic switch 720$_A$. For example, the first magnetic switch 720$_A$ may be substantially similar to the magnetic switch 520 illustrated in FIG. 5A.

In an embodiment, a second magnetic switch 720$_B$ may be an MTJ with a pair of magnetic layers that are separated by a barrier layer. One of the magnetic layers may be pinned, and the other magnetic layer may be unpinned. Controlling the magnetic orientation of the unpinned magnetic layer allows for current to flow or be restricted. The second magnetic switch 720$_B$ may be substantially similar to the magnetic memory 420 illustrated in FIG. 4D. In the illustrated embodiment, the magnetic switches 720$_A$ and 720$_B$ are shown in isolation. However, it is to be appreciated that the magnetic switches 720$_A$ and 720$_B$ may be coupled to the die 780 or other devices (not shown) in the electronic system 790.

Figure 8:
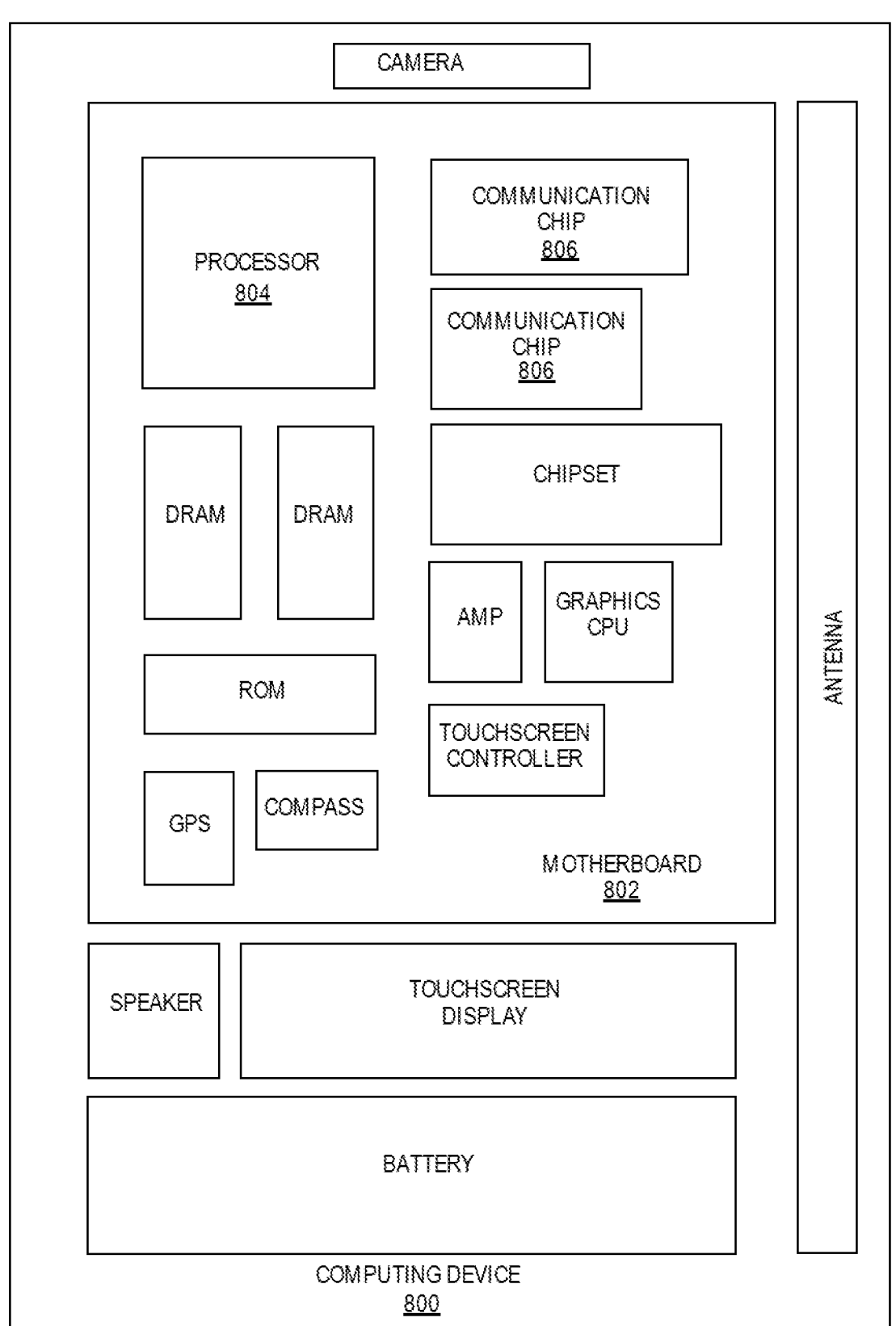
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be part of an electronic package that comprises a package substrate with a core that is patterned with a laser-assisted etching process to form an embedded magnetic switching device, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be part of an electronic package that comprises a package substrate with a core that is patterned with a laser-assisted etching process to form an embedded magnetic switching device, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a core, wherein the core comprises glass; an opening through the core; and a magnetic region disposed in the opening.

Example 2: the package substrate of Example 1, wherein the opening has an hourglass shaped cross-section.

Example 3: the package substrate of Example 1 or Example 2, wherein the magnetic region comprises a first magnetic layer and a second magnetic layer, wherein the first magnetic layer is spaced away from the second magnetic layer by a barrier layer.

Example 4: the package substrate of Example 3, wherein the first magnetic layer is a pinned ferromagnet, and wherein the second magnetic layer is an unpinned ferromagnet.

Example 5: the package substrate of Example 1 or Example 2, wherein a first barrier layer is above the magnetic region, and wherein a second barrier layer is below the magnetic region.

Example 6: the package substrate of Example 5, further comprising: a conductive trace embedded in the glass core adjacent to the magnetic region.

Example 7: the package substrate of Example 5 or Example 6, wherein at least one surface of the conductive trace is contacted by a material other than the glass core.

Example 8: the package substrate of Examples 1-7, wherein a channel configured for flowing a coolant is adjacent to the opening.

Example 9: an electronic package, comprising: a core; a buildup layer over the core; and a plurality of magnetic tunnel junctions (MTJs) in the core, wherein the plurality of MTJs are coupled to each other to form a memory cell Example 10: the electronic package of Example 9, wherein each MTJ of the plurality of MTJs comprises: an opening through the core; a first magnetic layer in the opening; a barrier layer under the first magnetic layer in the opening; and a second magnetic layer under the barrier layer in the opening.

Example 11: the electronic package of Example 10, wherein the first magnetic layer is a pinned ferromagnet, and wherein the second magnetic layer is an unpinned ferromagnet.

Example 12: the electronic package of Example 11, wherein a low resistance state through the MTJ occurs when the unpinned ferromagnet and the pinned ferromagnet have parallel magnetisms, and wherein a high resistance state through the MTJ occurs when the unpinned ferromagnet and the pinned ferromagnet have antiparallel magnetisms.

Example 13: the electronic package of Example 12, wherein the low resistance state is a binary logic 1 and wherein the high resistance state is a binary logic 0.

Example 14: the electronic package of Examples 9-13, wherein the opening has an hourglass shaped cross-section.

Example 15: an electronic package, comprising: a core; a buildup layer over the core; and a magnetic switch embedded in the core, wherein the magnetic switch comprises: an opening through the core; a first barrier layer in the opening; a magnetic layer below the first barrier in the opening; a second barrier layer below the magnetic layer in the opening; and a conductive trace adjacent to the magnetic layer.

Example 16: the electronic package of Example 15, wherein flowing current through the conductive trace aligns a magnetism in the magnetic layer to allow electrical conduction through the magnetic layer.

Example 17: the electronic package of Example 15 or Example 16, wherein the conductive trace has a trapezoidal cross-section.

Example 18: the electronic package of Example 17, wherein a surface of the conductive trace is covered by a material other than the core.

Example 19: the electronic package of Examples 15-18, wherein the magnetic switch is coupled to an antenna.

Example 20: the electronic package of Example 19, wherein the magnetic switch allows for propagation of signals from the antenna to a die when current is flowing in a first direction in the conductive trace, and for propagation of signals from the die to the antenna when current is flowing in a second direction in the conductive trace.

Example 21: the electronic package of Examples 15-20, further comprising a plurality of magnetic switches.

Example 22: the electronic package of Example 21, wherein the plurality of magnet switches are each coupled to a single die at first ends of the plurality of magnets, and wherein second ends of the plurality of magnetic switches are each coupled to different devices.

Example 23: an electronic system, comprising: a board; a package substrate coupled to the board, wherein the package substrate comprises: a core; a buildup layer over the core; an opening through the core; and a magnetic region disposed in the opening; and a die coupled to the package substrate.

Example 24: the electronic package of Example 23, wherein the magnetic region is between a pair of barrier layers.

Example 25: the electronic package of claim 23, wherein the magnetic region comprises: a first magnetic layer that is a pinned ferromagnet; a barrier layer; and a second magnetic layer that is an unpinned ferromagnet.

What is claimed is:

1. A package substrate, comprising:
a core, wherein the core comprises glass;
an opening through the core, wherein the opening has an hourglass shaped cross-section;
a magnetic region disposed in the opening; and
an unfilled opening in the core, the unfilled opening laterally spaced apart from the magnetic region in the opening.

2. The package substrate of claim 1, wherein the magnetic region comprises a first magnetic layer and a second magnetic layer, wherein the first magnetic layer is spaced away from the second magnetic layer by a barrier layer.

3. The package substrate of claim 2, wherein the first magnetic layer is a pinned ferromagnet, and wherein the second magnetic layer is an unpinned ferromagnet.

4. The package substrate of claim 1, wherein a first barrier layer is above the magnetic region, and wherein a second barrier layer is below the magnetic region.

5. The package substrate of claim 4, further comprising:
a conductive trace embedded in the glass core adjacent to the magnetic region.

6. The package substrate of claim 4, wherein at least one surface of the conductive trace is contacted by a material other than the glass core.

7. The package substrate of claim 1, wherein the unfilled opening is a channel configured for flowing a coolant is adjacent to the opening.

8. An electronic package, comprising:
a core;
a buildup layer over the core;
a plurality of openings through the core, wherein each of the plurality of openings has an hourglass shaped cross-section;

a plurality of magnetic tunnel junctions (MTJs) in corresponding ones of the openings in the core, wherein the plurality of MTJs are coupled to each other to form a memory cell; and an unfilled opening in the core, the unfilled opening laterally spaced apart from the plurality of MTJs in the plurality of openings.

9. The electronic package of claim 8, wherein each MTJ of the plurality of MTJs comprises:

a first magnetic layer in the opening;

a barrier layer under the first magnetic layer in the opening; and a second magnetic layer under the barrier layer in the opening.

10. The electronic package of claim 9, wherein the first magnetic layer is a pinned ferromagnet, and wherein the second magnetic layer is an unpinned ferromagnet.

11. The electronic package of claim 10, wherein a low resistance state through the MTJ occurs when the unpinned ferromagnet and the pinned ferromagnet have parallel magnetisms, and wherein a high resistance state through the MTJ occurs when the unpinned ferromagnet and the pinned ferromagnet have antiparallel magnetisms.

12. The electronic package of claim 11, wherein the low resistance state is a binary logic 1 and wherein the high resistance state is a binary logic 0.

13. An electronic package, comprising:

a core;

a buildup layer over the core;

a magnetic switch embedded in the core, wherein the magnetic switch comprises:

an opening through the core, wherein the opening has an hourglass shaped cross-section;

a first barrier layer in the opening;

a magnetic layer below the first barrier in the opening;

a second barrier layer below the magnetic layer in the opening; and a conductive trace adjacent to the magnetic layer; and an unfilled opening in the core, the unfilled opening laterally spaced apart from the opening of the magnetic switch.

14. The electronic package of claim 13, wherein flowing current through the conductive trace aligns a magnetism in the magnetic layer to allow electrical conduction through the magnetic layer.

15. The electronic package of claim 13, wherein the conductive trace has a trapezoidal cross-section.

16. The electronic package of claim 15, wherein a surface of the conductive trace is covered by a material other than the core.

17. The electronic package of claim 13, wherein the magnetic switch is coupled to an antenna.

18. The electronic package of claim 17, wherein the magnetic switch allows for propagation of signals from the antenna to a die when current is flowing in a first direction in the conductive trace, and for propagation of signals from the die to the antenna when current is flowing in a second direction in the conductive trace.

19. The electronic package of claim 13, further comprising a plurality of magnetic switches.

20. The electronic package of claim 19, wherein the plurality of magnet switches are each coupled to a single die at first ends of the plurality of magnets, and wherein second ends of the plurality of magnetic switches are each coupled to different devices.

21. An electronic system, comprising:

a board;

a package substrate coupled to the board, wherein the package substrate comprises:

a core;

a buildup layer over the core;

an opening through the core, wherein the opening has an hourglass shaped cross-section; and a magnetic region disposed in the opening;

an unfilled opening in the core, the unfilled opening laterally spaced apart from the magnetic region in the opening a die coupled to the package substrate.

22. The electronic package of claim 21, wherein the magnetic region is between a pair of barrier layers.

23. The electronic package of claim 21, wherein the magnetic region comprises:

a first magnetic layer that is a pinned ferromagnet;

a barrier layer; and a second magnetic layer that is an unpinned ferromagnet.

24. A package substrate, comprising:

a core, wherein the core comprises glass;

an opening through the core; and a magnetic region disposed in the opening, wherein a channel configured for flowing a coolant is adjacent to the opening.

* * * * *